(12) United States Patent
Okuni et al.

(10) Patent No.: US 7,764,748 B2
(45) Date of Patent: Jul. 27, 2010

(54) RECEIVER, WIRELESS DEVICE AND METHOD FOR CANCELLING A DC OFFSET COMPONENT

(75) Inventors: Hidenori Okuni, Kawasaki (JP); Rui Ito, Chigasaki (JP); Hiroshi Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 525 days.

(21) Appl. No.: 11/851,680

(22) Filed: Sep. 7, 2007

(65) Prior Publication Data
US 2008/0181334 A1 Jul. 31, 2008

(30) Foreign Application Priority Data
Jan. 26, 2007 (JP) ............................. 2007-016289

(51) Int. Cl.
H03K 9/00 (2006.01)
H04L 27/00 (2006.01)
(52) U.S. Cl. .................. 375/316; 375/317; 375/345
(58) Field of Classification Search .............. 375/316, 375/317, 345
See application file for complete search history.

(56) References Cited

U.S. PATENT DOCUMENTS

| | | | |
|---|---|---|---|
| 6,400,318 B1 | 6/2002 | Kasami et al. | |
| 6,816,712 B2 * | 11/2004 | Otaka et al. | 455/83 |
| 7,245,894 B2 * | 7/2007 | Sekiguchi et al. | 455/242.1 |
| 2008/0198949 A1 | 8/2008 | Okuni et al. | |

FOREIGN PATENT DOCUMENTS

| | | |
|---|---|---|
| JP | 2001-160708 | 6/2001 |
| JP | 2002-94346 | 3/2002 |
| JP | 2007-110765 | 4/2007 |
| JP | 2007-151160 | 6/2007 |

* cited by examiner

Primary Examiner—Ted M Wang
(74) Attorney, Agent, or Firm—Oblon, Spivak, McClelland, Maier & Neustadt, L.L.P.

(57) ABSTRACT

A receiver includes a memory for storing DC offset amounts in accordance with a DC offset component remaining in a received signal; a first DC offset component-removing unit configured so as to generate a first DC offset amount from the DC offset amounts stored in the memory and to remove the first DC offset amount from the received signal; an amplifier for amplifying a signal output from the first DC offset component-removing unit; and a second DC offset component-removing unit configured so as to generate a second DC offset amount from the DC offset amounts stored in the memory in view of a gain of the amplifier and remove the second DC offset amount from the signal amplified by the amplifier.

18 Claims, 9 Drawing Sheets

RECEIVER, WIRELESS DEVICE AND METHOD FOR CANCELLING A DC OFFSET COMPONENT

CROSS-REFERENCE TO RELATED APPLICATIONS

This application is based upon and claims the benefit of priority from the prior Japanese Patent Application No. 2007-16289, filed on Jan. 26, 2007; the entire contents of which are incorporated herein by reference.

BACKGROUND OF THE INVENTION

1. Field of the Invention

The present invention relates to receiving technique in wireless communication, particularly, to a receiver to remove a DC offset component remaining in a received signal, a wireless device using the receiver and a method for cancelling a DC offset component.

2. Description of the Related Art

With a wireless device such as a receiver to be employed in wireless communication, a direct conversion system to directly convert the frequency of a signal received is widely available. With the direct conversion system, since the received signal is multiplied by a local signal to gain an intended baseband signal, a DC offset component may be generated originated from the leak of the local signal so as to deteriorate the receiving performance of the wireless device. In this point of view, it is required that the DC offset component is removed.

Generally, the DC offset component is removed by means of a DC offset canceller. For example, the DC offset canceller may be configured such that the amounts of DC offsets are measured over the range of amplification gain of the intended baseband signal, and stored in a memory per amplification gain. Namely, when the amplification gain is switched, the corresponding DC offset amount is read out from the memory and subtracted from the signal output through the amplifier (Reference 1).

[Reference 1] JP-A 2002-94346 (KOKAI)

In the conventional DC offset canceller as described above, the DC offset component, generated at the amplifier, is removed at the output side of the amplifier. In this point of view, therefore, the DC offset component generated at the input side of the amplifier such as a DC offset component generated at the frequency converter, e.g., to convert a wireless signal into the corresponding baseband signal can not be removed in front of the amplifier in advance. If a signal containing the DC offset component is amplified at the amplifier, the amplification of the signal is saturated due to the DC offset component so that the signal can not be amplified sufficiently. As a result, the receiving performance of the signal may be deteriorated remarkably at the corresponding receiver.

BRIEF SUMMARY OF THE INVENTION

It is an object of the present invention, in view of the above conventional problems, to provide a receiver which can remove a DC offset component from a signal to be received even under the condition of the amplification of the signal, a wireless device using the receiver and the corresponding method of cancelling a DC offset component.

In order to achieve the above object, an aspect of the present invention relates to a receiver including: a memory for storing DC offset amounts in accordance with a DC offset component remaining in a received signal; a first DC offset component-removing unit configured so as to generate a first DC offset amount from the DC offset amounts and to remove the first DC offset amount from the received signal; an amplifier for amplifying a signal output from the first DC offset component-removing unit; and a second DC offset component-removing unit configured so as to generate a second DC offset amount from the DC offset amounts stored in the memory in view of a gain of the amplifier and remove the second DC offset amount from the signal amplified by the amplifier.

Another aspect of the present invention relates to a wireless device, including; a receiver as defined above for receiving a given receiver signal; a transmitter for transmitting a given transmitter signal and coupled with the receiver; and an antenna for receiving the receiver signal and transmitting the transmitter signal.

Still another aspect of the present invention relates to a method for cancelling a DC offset component, including; storing DC offset amounts in a memory in accordance with a DC offset component remaining in a received signal; generating a first DC offset amount from the DC offset amounts stored in the memory and removing the first DC offset amount from the received signal; amplifying the received signal by an amplifier by a predetermined gain after the first DC offset amount is removed; and generating a second DC offset amount from the DC offset amounts stored in the memory in view of the gain of the amplifier and removing the second DC offset amount from the received signal amplified by the amplifier.

According to the aspects of the invention can be removed the DC offset component effectively and efficiently from the corresponding signal even under the condition of the amplification of the signal.

DETAILED DESCRIPTION OF THE INVENTION

Figure 1:
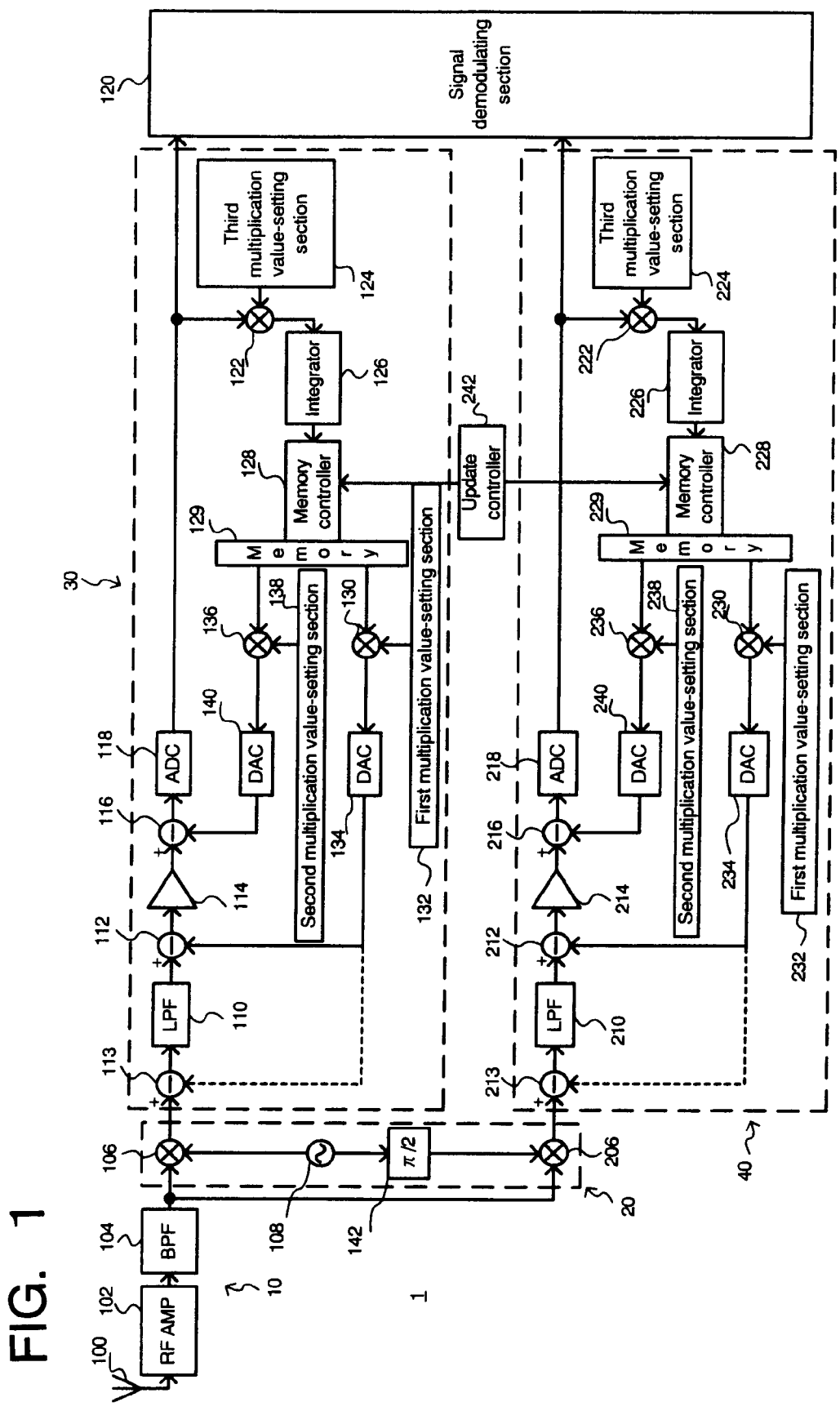
FIG. 1 is a block diagram relating to the structure of the receiver according to a first embodiment.

The embodiments will be described with reference to drawings. FIG. 1 is a block diagram relating to the structure of the receiver according to a first embodiment. As illustrated in FIG. 1, the receiver 1 in this embodiment includes an RF unit 10, a frequency converting unit 20, an I channel processing unit 30, a Q channel processing unit 40 and a signal demodulating unit 120.

The RF unit 10 includes an antenna 100, a high frequency amplifier (RF amplifier) 102 and a bandpass filter (BPF) 104 so as to receive a high frequency radio wave and output the corresponding received signal. The radio wave is mainly received by the antenna 100, and amplified to a desired gain level by the RF amplifier 102. In this case, unnecessary frequency components in the signal are removed by the BPF 104 so that the intended frequency component(s) can be extracted from the signal.

The frequency converting unit 20 includes a first mixer 106, a second mixer 206, a local oscillator 108 and a π/2 phase shifter 142 so as to convert the received signal of high frequency into the corresponding baseband signal. The local oscillator 108 generates a local signal for converting the received signal into the corresponding baseband signal after the BPF 104. Moreover, the local oscillator 108 supplies the generated local signal to the first mixer 106 and the π/2 phase shifter 142. The received signal through the BPF 104 is mixed with the local signal oscillated from the local oscillator 108 at the first mixer 106, thereby being converted into the corresponding I channel baseband signal. The phase of the local signal oscillated from the local oscillator 108 is shifted by π/2 at the π/2 phase shifter 142. Then, the local signal is supplied to the second mixer 206 from the π/2 phase shifter 142. The received signal through the BPF 104 is mixed with the local signal controlled in phase at the π/2 phase shifter 142 at the second mixer 206, thereby being converted into the corresponding Q channel baseband signal.

The I channel processing unit 30 includes a low-pass filter (LPF) 110, a baseband amplifier (amplifier) 114 and an analog-digital converter (ADC) 118 so as to convert the I channel baseband signal into the corresponding digital signal and supply the digital signal to the signal demodulating unit 120. Furthermore, the I channel processing unit 30 includes subtracters 112/113/116, a first multiplier 122, a third multiplication value-setting unit 124, an integrator 126, a memory controller 128, a memory 129, a second multiplier 130, a first multiplication value-setting unit 132, a first digital-analog converter (DAC) 134, a third multiplier 136, a second multiplication value-setting unit 138 and a second DAC 140 so as to remove the DC offset component remaining in the I channel baseband signal.

The LPF 110 removes unnecessary frequency components of the I channel baseband signal so that the intended frequency component(s) can be extracted from the I channel baseband signal. The amplifier 114 amplifies the I channel baseband signal to a desired gain level enough to digitally convert the baseband signal after the LPF 110. The amplified baseband signal is converted into the digital signal at the ADC 118, and supplied to the signal demodulating unit 120.

The subtracters 112/113 are connected with the input of the amplifier 114 so as to remove the DC offset component contained in the I channel baseband signal. Concretely, the subtracter 112 is connected with the input of the amplifier 114 and the output of the LPF 110 so as to remove the DC offset component contained in the I channel baseband signal output from the LPF 110. The subtracter 113 is connected with the output of the first mixer 106 and the input of the LPF 110 so as to remove the DC offset component contained in the I channel baseband signal output from the first mixer 106. In this embodiment, although both of the subtracters 112 and 113 are provided, either of the subtracters 112 and 113 may be provided.

The subtracter 116 is disposed at the output of the amplifier 114 so as to remove the DC offset component contained in the I channel baseband signal. Concretely, the subtracter 116 is connected with the output of the amplifier 114 and the input of the ADC 118 so as to remove the DC offset component contained in the I channel baseband signal amplified by the amplifier 114.

The first multiplier 122 multiplies the I channel baseband signal digitally converted at the ADC 118 by the third multiplication value supplied from the third multiplication value-setting unit 124. The third multiplication value supplied from the third multiplication value-setting unit 124 is a coefficient to control the period of time for removing the DC offset component. The third multiplication value-setting unit 124 may configured such that the third multiplication value can be retained in the self-memory installed therein or defined dynamically and externally. The integrator 126 integrates the signal multiplied at the first multiplier 122.

The memory controller 128 functions as storing data in the memory 129 and reading out the data from the memory 129. In this case, the memory controller 128 stores the data integrated at the integrator 126 in the memory 129 and reads out the data from the memory 129. The read out data is transmitted to the multipliers 130/136. Moreover, the memory controller 128 is configured such that the read/write of the data in the memory 129 can be controlled on the indication signal from the update controller 242.

The second multiplier 130 and the third multiplier 136 multiply the data read out from the memory 129 by the first multiplication value from the first multiplication value-setting unit 132 and the second multiplication value from the second multiplication value-setting unit 138. The first multiplication value-setting unit 132 and the second multiplication value-setting unit 138 may be configured such that the first multiplication value and the second multiplication value can be retained in the self-memory installed therein or defined dynamically and externally. Alternatively, the first multiplication value-setting unit 132 and the second multiplication value-setting unit 138 may be configured so as to be linked with the variable amplification of the amplifier 114. The first multiplication value and the second multiplication value which are supplied from the first multiplication value-setting unit 132 and the second multiplication value-setting unit 138, respectively are multiplication coefficients which are determined by the amplification of the amplifier 114, and satisfy the equation (1) as follows:

$$\frac{\text{Second multiplication value}}{\text{First multiplication value}} \geq \text{Gain of bass band amplifier} \quad (1)$$

The first DAC 134 and the second DAC 140 converts the multiplied data which are obtained at the second multiplier 130 and the third multiplier 136 into the corresponding analog data. The thus obtained analog data are supplied to the subtracters 112/113/116, respectively. Namely, the first DAC 134 and the second DAC 140 generates the analog offset amount corresponding to the DC offset components to be removed by the subtracters 112/113/116.

The update controller 242 functions as determining the write timing of data, that is, the update timing of data into the memory 129 by the memory controller 128. In other words, the update controller 242 functions as indicating the write/read processing to the memory controller 129.

The Q channel processing unit 40 has the same structure as the one of the I channel processing unit 30. Namely, the Q channel processing unit 40 includes an LPF 40, an amplifier 214 and an ADC 218 so that the Q channel baseband signal is digitally converted and supplied to the signal demodulating unit 120. Furthermore, the I channel processing unit 40 includes subtracters 212/213/216, a first multiplier 222, a third multiplication value-setting unit 224, an integrator 226, a memory controller 228, a memory 229, a second multiplier 230, a first multiplication value-setting unit 232, a first digital-analog converter (DAC) 234, a third multiplier 236, a second multiplication value-setting unit 238 and a second DAC 240 so as to remove the DC offset component remaining in the I channel baseband signal. Some components included in the Q channel processing unit 40 are similar to the ones included in the I channel processing unit 30 so that the explanation for the components of the Q channel processing unit 40 similar to the ones of the I channel processing unit 30 will be omitted.

The signal demodulating unit 120 demodulates the I channel baseband signal and the Q channel based band signal by a prescribed demodulating method, and thus, restores the corresponding original data.

Figure 2:
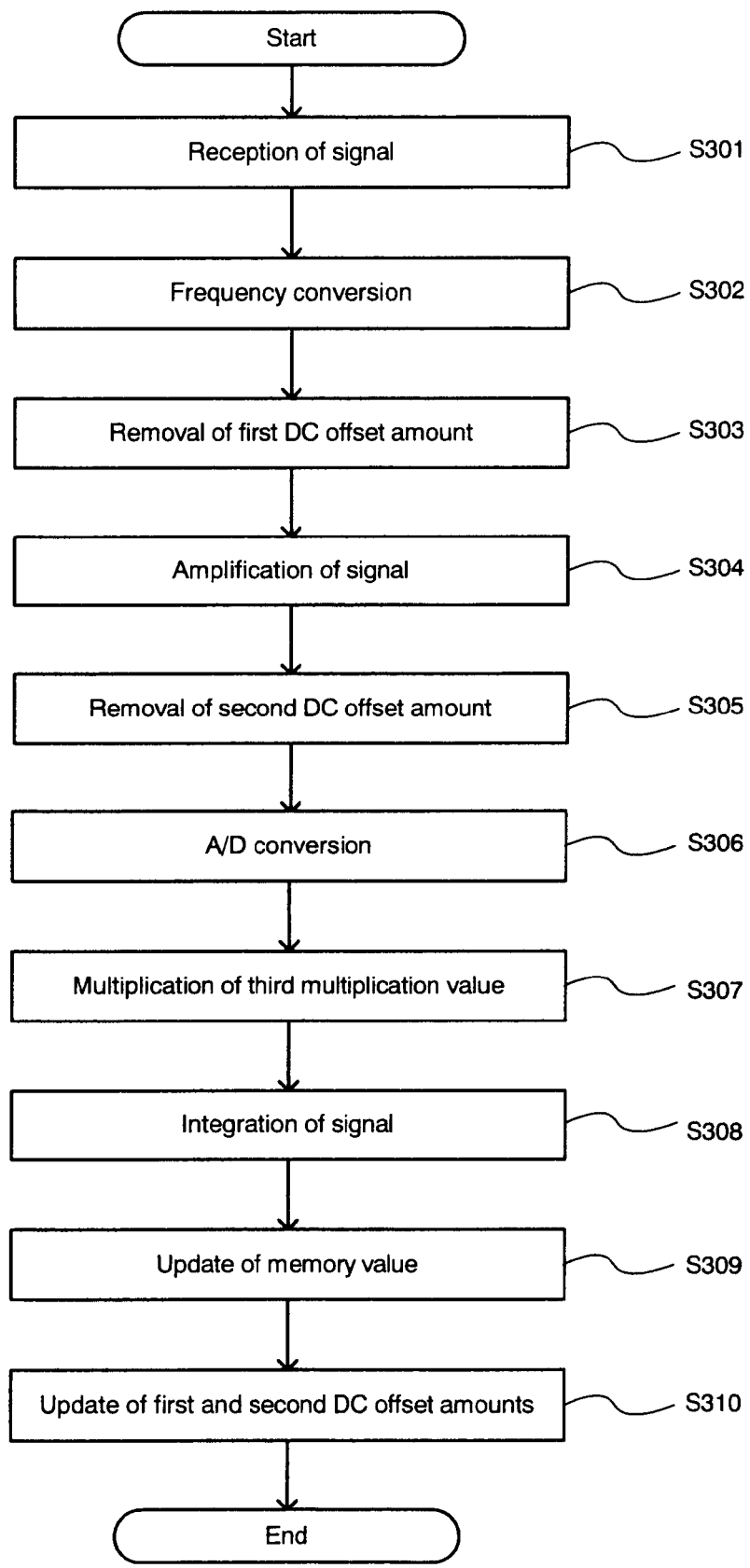
FIG. 2 is a flowchart relating to the operation of the receiver in the first embodiment.

Then, the operation of the receiver 1 will be described hereinafter with reference to FIG. 2. FIG. 2 is a flowchart relating to the operation of the receiver 1 in this embodiment. In this embodiment, suppose that the amount of the DC offset contained in the received signal converted at the first mixer 106 is 10.99 and the least significant bit (hereafter, called as a "LSB") representing the accuracies of the DAC 134/140 is 1. Then, suppose that the DC offset amount of 10.99 is stored in the memory 129 in advance and the gain of the amplifier 114 is 100 times. For simplification, the first multiplication value is set to 1, and the accuracy of the ADC 118 is indefinite (under no quantum error), and the second multiplication value is 100 (=the second multiplication value/the first multiplication value) which is equal to the gain of the amplifier 114.

The RF amplifier 102 amplifies the received signal by the antenna 100. The amplified signal is transmitted to the BPF 104. (A) predetermined frequency component(s) within a predetermined frequency range can be passed through the BPF 104. Namely, the RF unit 10 can receive the predetermined frequency component(s) from the received signal by the antenna 100 (S301).

The local oscillator 108 oscillates a local signal for converting the frequency component(s) of the signal through the BPF 104. The local signal is supplied to the first mixer 106 and the π/2 phase shifter 142. The local signal supplied from the local oscillator 108 is shifted in phase by π/2 at the π/2 phase shifter 142 and supplied to the second mixer 206. The first mixer 106 mixes the received signal (frequency component(s)) through the BPF 104 with the local signal generated at the local oscillator 108 so that the received signal (frequency component(s)) can be converted into the corresponding baseband signal. Similarly, the second mixer 206 mixes the received signal (frequency component(s)) through the BPF 104 with the local signal shifted in phase at the π/2 phase shifter 142 so that the received signal (frequency component(s)) can be converted into the corresponding baseband signal. Namely, the received signal (frequency component(s)) are converted into the corresponding baseband signals (I channel signal and Q channel signal) at the frequency converting unit 20 (S302).

The baseband signal through the first mixer 106 is input into the subtracter 113 so as to be subtracted by the value corresponding to the DC offset amount transmitted from the first DAC 134, and then, transmitted to the LPF 110. Herein, the first DAC 134 supplies the value roughly relating to the DC offset amount (corresponding a value not less than the LSB representing the accuracy of the first DAC 134). Namely, the subtracter 113 removes the DC offset amount corresponding to the value which is operably generated by the first DAC 134 from the converted baseband signal (S303).

The LPF 110 removes unnecessary frequency component(s) from the baseband signal output from the subtracter 113. The baseband signal is input into the subtracter 112 after the LPF 110 so as to be subtracted by the value corresponding to the DC offset amount transmitted from the first DAC 134, and then, transmitted to the amplifier 114. The subtracter 112 functions in the same manner as the subtracter 113. Namely, the subtracters 112 and 113 remove the value roughly relating to the DC offset amount from the baseband signal at the input and the output of the LPF 110, respectively. In this point of view, either of the subtracters 112 and 113 may be provided. Since the subtracters 112 and 113 can remove the DC offset amount of 1 or more, the subtracters 112 and 113 can remove the DC offset amount of 10 from the baseband signal. As a result, the DC offset amount of 0.99 remains in the baseband signal.

The baseband signal (received signal), transmitted from the subtracter 112 (or the LPF 110), is amplified at the amplifier 114 by a predetermined gain. The amplifier 114 may be configured such that the gain can be controlled in dependence on the amplitude of the baseband signal (received signal). The remaining DC offset amount of 0.99 is amplified by 100 times at the amplifier 114 so that the amplified baseband signal (received signal) contains the DC offset amount of 0.99× 100=99.

The subtracter 116 subtracts the value corresponding to the DC offset amount from the second DAC 140 from the baseband signal (received signal) from the amplifier 114. The DC offset amount from the second DAC 140 is small enough to be a value not more than the LSB representing the accuracy of the second DAC 140 in view of the amplification of the amplifier 114. Namely, the subtracter 116 subtracts the DC offset amount amplified by the amplifier 114 from the baseband signal (received signal) (S305). Since the second multiplication value is set to 100, the DC offset amount to be removed by the subtracter 116 is set to 99 by the multiplication of the second multiplication value of 100 with the DC offset amount of 0.99 remaining from the DC offset amount of 10.99 which is stored in the memory 129. Namely, the DC offset amount remaining in the baseband signal from the amplifier 114 is removed by the subtracter 116.

The ADC 118 digitally converts the baseband signal from the subtracter 116 (S306). The thus obtained digital signal is transmitted to the signal demodulating unit 120 and then, demodulated as the I channel signal. The I channel signal is transmitted to the first multiplier 122.

The first multiplier 122 multiplies the digital signal converted at the ADC 118 by the third multiplication value supplied from the third multiplication value-setting unit 124. The thus obtained multiplied signal is transmitted to the integrator 126 (S307). The integrator 126 integrates the multiplied signal by the third multiplication value (S308). The thus obtained integrated signal is transmitted to the memory controller 128.

The memory controller 128 receives the integrated signal at a predetermined update timing, and writes the integrated signal into the memory 129 (S309). The update timing to update the data in the memory 129 by the memory controller 128 is supplied from the update controller 242.

The second multiplier 130 reads out the data corresponding to the DC offset amount to be removed by the subtracter 112 and/or the subtracter 113 from the memory 129, and then, multiplies the data by the first multiplication value supplied from the first multiplication value-setting unit 132. The thus obtained multiplied data is transmitted to the first DAC 134. Similarly, the third multiplier 136 reads out the data corresponding to the DC offset amount to be removed by the subtracter 116 from the memory 129, and then, multiplies the data by the second multiplication value supplied from the second multiplication value-setting unit 138. The thus obtained multiplied data is transmitted to the second DAC 140. The transmitted data are converted into the corresponding analog data at the DACs 134 and 140, respectively, and then, transmitted to the subtracters 112/113/116. In this case, if the data stored in the memory 129 is rewritten, the first DC offset amount and the second offset amount which are to be subtracted by the subtracters 112/113/116 are also updated (S310).

The operation of the subtracter 213 through the second DAC 240 can be performed in the same manner as the operation of the subtracter 113 through the second DAC 240. In this point of view, the operation of the subtracter 213 through the second DAC 240 will not be described.

In this way, in the receiver 1, the DC offset component can be roughly removed by the subtracters 112/113 by the amount of 10 in this embodiment), and finely removed by the subtracter 116 (by the amount of 99 in this embodiment), which means the increase of the accuracy margins of the DACs 134/140 relating to the LSB. Therefore, an expensive DAC is not required.

In this embodiment, the gain of the amplifier 114 is set equal to the estimated gain (=the second multiplication value/ the first multiplication value), but often different from the estimated gain. If the estimated gain is set to 100 and the gain of the amplifier 114 is set to 103, the DC offset amount to be output from the amplifier 114 is set to 101.97 (=0.99×103). In this case, the DC offset amount can not be removed by the subtracters 112/113/116 because the subtracter 116 functions as removing the remaining DC offset component from the subtracters 112/113 of 1×100=100 or less which is calculated by the multiplication of the 1LSB accuracy by the gain of the amplifier 114.

In this case, the ratio of the second multiplication value to the first multiplication value is set equal to or more than the gain of the amplifier 114 as represented by the equation (1). For example, if the first multiplication value is set to 1 and the second multiplication value is set to 105, the subtracter 116 can remove the remaining DC offset component of 1×105 or less which is calculated by the multiplication of the 1LSB accuracy by the gain of the amplifier 114. In this case, therefore, the DC offset component of 101.95 from the amplifier 114 can be removed.

Herein, if the removal amount for the remaining DC offset component becomes larger than the remaining DC offset component, another DC offset component may be generated. The DC offset component newly generated can be removed by the feedback group consisting of the first multiplier 122, the third multiplication value-setting unit 124 and the integrator 126 because the DC offset component stored in the memory 129 is converged to the DC offset value of 103.95.

Then, the update operation of the memory 129 will be described. In the receiver 1 in this embodiment, all of the DC offset amounts generated in the received signal-processing system is stored in the memory 129, and will be updated. The memory 129 can be updated at the operation of the memory controller 128 at the power-on of the receiver 1 when the time variation of the DC offset amount is small relatively for the DC offset component. The memory 129 can be also updated (set) once at the shipping of the receiver 1 when the time variation of the DC offset amount is small relatively for the DC offset component.

Figure 3:
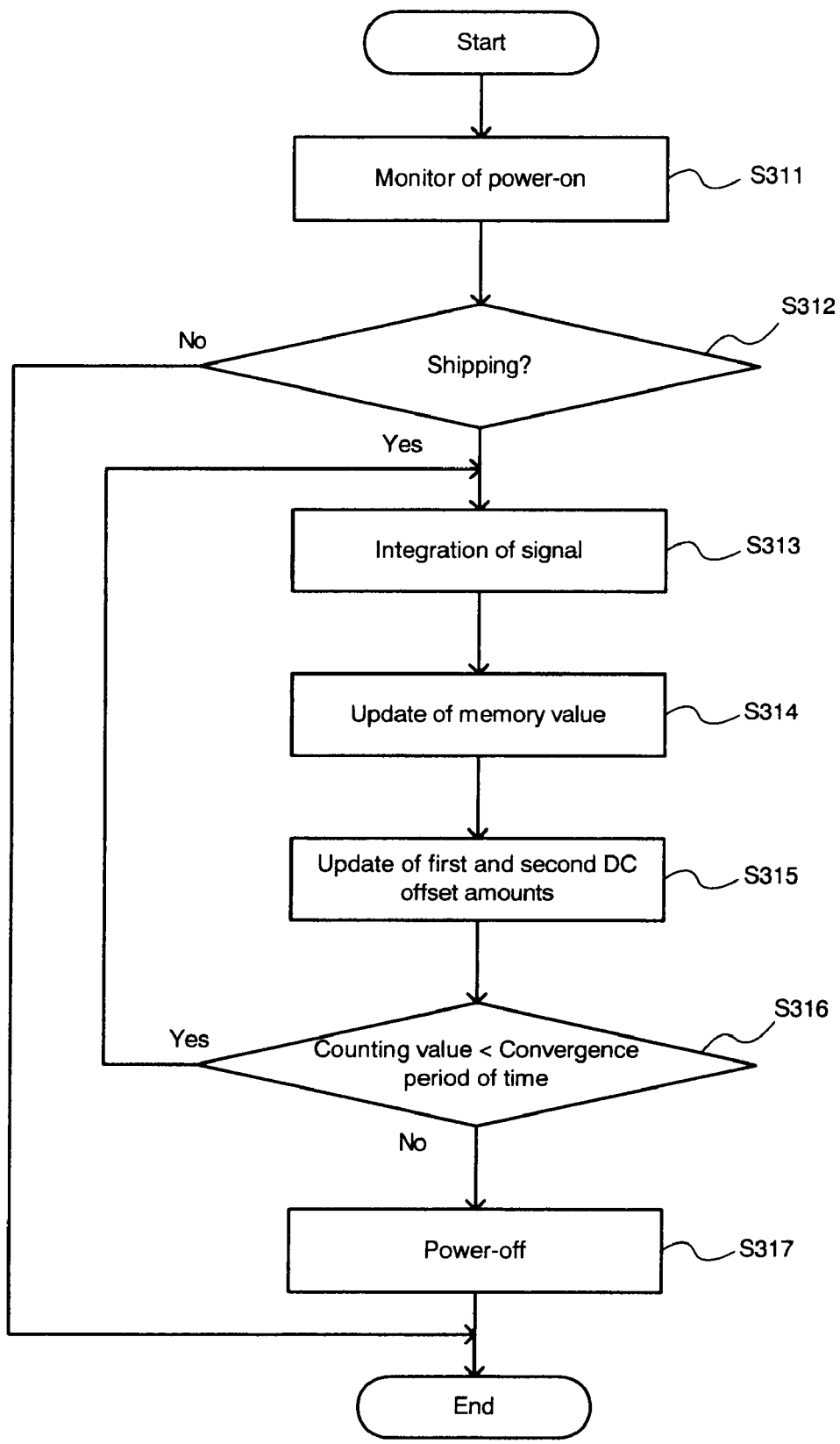
FIG. 3 is a flowchart relating to the updating operation of a memory value in the receiver of the first embodiment.

FIG. 3 is a flowchart relating to the updating operation of a memory value in the receiver 1 in this embodiment. In the flowchart, the updating operation will be performed once before use such as shipping. In this operation, the update controller 242 always monitors the power condition of the receiver 1 (S311). When the update controller 242 detects the power-on of the receiver 1, the update controller 242 determines whether the receiver 1 is to be shipped or not (whether the intended memory value is set (stored) or not) (S312). If the intended memory value is set (corresponding to the indication "No" at S312), another memory value is not newly set (stored).

If the intended memory value is not set (corresponding to the indication "Yes" at S312), the update controller 242 performs the memory value-setting operation. The first multiplier 122 multiplies the baseband signal (received signal) transmitted from the ADC 118 by the third multiplication value supplied from the third multiplication value-setting unit 124. The integrator 126 integrates the thus obtained multiplication data (S313). The memory controller 128 stores the thus obtained integration value into the memory 129 according to the indication from the update controller 242 (S314).

The second multiplier 130 and the third multiplier 136 read out the corresponding memory values which are multiplied by the first multiplication value and the second multiplication value, respectively. The thus obtained multiplied data are supplied to the first DAC 134 and the second DAC 140, respectively, and converted into the corresponding analog data thereat. The thus obtained analog data is transmitted to the subtracters 112/113/116, respectively, so that the DC offset amount to be subtracted by the subtracters 112/113/116 can be updated (S315).

The update controller 242 includes a timer so that the convergence period of time for converging the DC offset value to the remaining DC offset amount to be removed can be compared with a given timer counting value (S316). When the timer counting value is smaller than (does not approach) the convergence period of time (corresponding to the indication "Yes" at S316), the multiplication by the first multiplier 122, the integration by the integrator 126 (S313), the memory writing by the memory controller 128 and the memory 129 (S314) and the subtraction using the DC offset amount updated by the new memory value (S315) are repeated.

When the timer counting value becomes equal to (approaches) the convergence period of time (corresponding to the indication "No" at S313, the update controller 242 indicates the power-off for the electric power source (not shown) so that the updating operation can be finished. In this embodiment, therefore, the initial setting for the DC offset amount can be performed only if the receiver 1 is powered-on once at the shipping.

Figure 4:
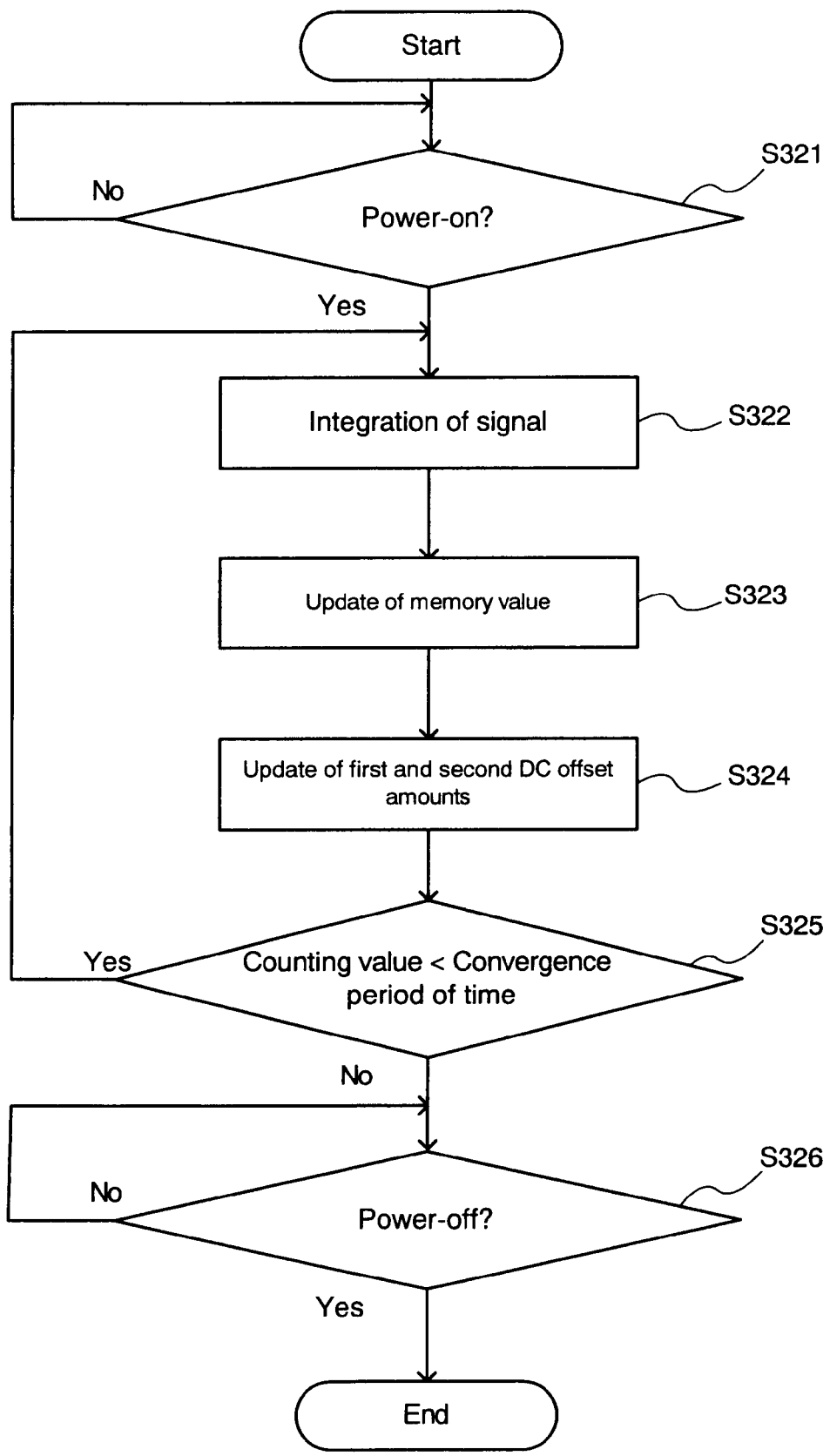
FIG. 4 is another flowchart relating to the updating operation of a memory value in the receiver of the first embodiment.

Then, another updating operation will be described with reference to FIG. 4. FIG. 4 is a flowchart relating to the updating operation (the memory value-setting operation) using the power-on of the receiver 1. In this operation, the update controller 242 always monitors the power condition of the receiver 1 (S321). When the update controller 242 detects the power-on of the receiver 1 (corresponding to the indication "Yes" at S321), the memory value-setting operation is performed. The first multiplier 122 multiplies the baseband signal (received signal) transmitted from the ADC 118 by the third multiplication value supplied from the third multiplication value-setting unit 124. The integrator 126 integrates the thus obtained multiplication value (S322). The memory controller 128 stores the thus obtained integration value into the memory 129 according to the indication from the updating controller 242 (S323).

The second multiplier 130 and the third multiplier 136 read out the corresponding memory values which are multiplied by the first multiplication value and the second multiplication value, respectively. The thus obtained multiplication data are supplied to the first DAC 134 and the second DAC 140, respectively, and converted into the corresponding analog data thereat. The thus obtained analog data is transmitted to the subtracters 112/113/116, respectively, so that the DC offset amount to be subtracted by the subtracters 112/113/116 can be updated (S324).

The update controller 242 includes a timer so that the convergence period of time for converging the DC offset value to the remaining DC offset amount to be removed can be compared with a given timer counting value. When the timer counting value is smaller than (does not approach) the convergence period of time (corresponding to the indication "Yes" at S325), the multiplication by the first multiplier 122, the integration by the integrator 126 (S322), the memory writing by the memory controller 128 and the memory 129 (S323) and the subtraction using the DC offset amount updated by the new memory value (S324) are repeated.

When the timer counting value becomes equal to (approaches) the convergence period of time (corresponding to the indication "No" at S325), the update controller 242 starts to monitor the electric power source (S326). When the electric power source is powered-off (corresponding to the indication "Yes" at S326), the updating operation can be finished. In this embodiment, therefore, the initial setting (update) for the DC offset amount can be performed at every time when the electric power source is powered-on. The updating operation (memory value-setting operation) in this embodiment is effective under the condition that the time variation (e.g., due to the change in temperature of the external atmosphere) of the DC offset amount in the receiver 1 is relatively large.

Figure 5:
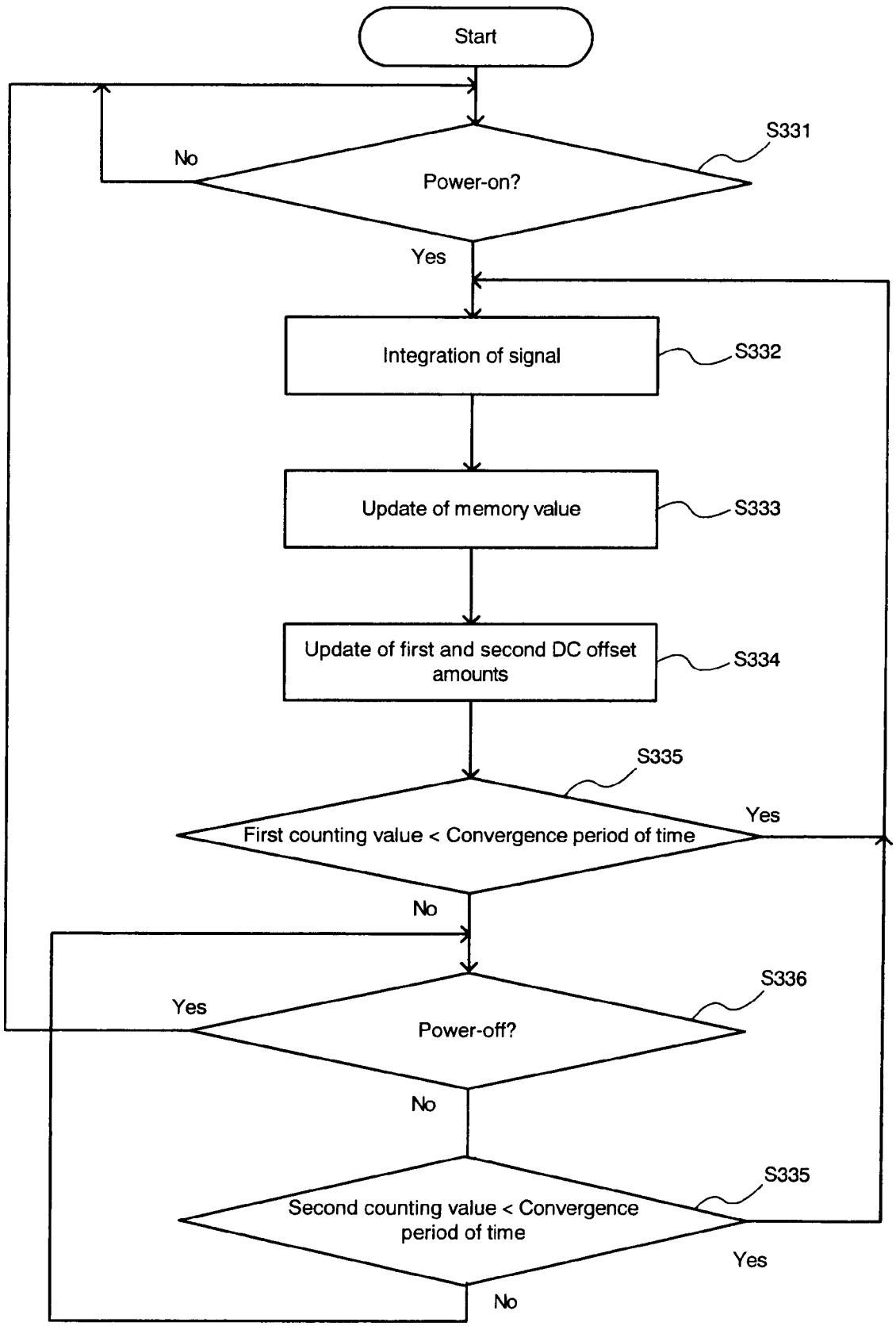
FIG. 5 is still another flowchart relating to the updating operation of a memory value in the receiver of the first embodiment.

Then, still another updating operation will be described with reference to FIG. 5. FIG. 5 is a flowchart relating to the updating operation using the power-on of the receiver 1 and time interval. In this operation, the update controller 242 always monitors the power condition of the receiver 1 (S331). When the update controller 242 detects the power-on of the receiver 1 (corresponding to the indication "Yes" at S331), the memory value-setting operation is performed. The first multiplier 122 multiplies the baseband signal (received signal) transmitted from the ADC 118 by the third multiplication value supplied from the third multiplication value-setting unit 124. The integrator 126 integrates the thus obtained multiplication value (S322). The memory controller 128 stores the thus obtained integration value into the memory 129 according to the indication from the updating controller 242 (S333).

The second multiplier 130 and the third multiplier 136 read out the corresponding memory values which are multiplied by the first multiplication value and the second multiplication value, respectively. The thus obtained multiplication data are supplied to the first DAC 134 and the second DAC 140, respectively, and converted into the corresponding analog data thereat. The thus obtained analog data is transmitted to the subtracters 112/113/116, respectively, so that the DC offset amount to be subtracted by the subtracters 112/113/116 can be updated (S334).

The update controller 242 includes two timers so that the convergence period of time for converging the DC offset value to the remaining DC offset amount to be removed can be compared with a first timer counting value. When the first timer counting value is smaller than (does not approach) the convergence period of time (corresponding to the indication "Yes" at S335), the multiplication by the first multiplier 122, the integration by the integrator 126 (S332), the memory writing by the memory controller 128 and the memory 129 (S333) and the subtraction using the DC offset amount updated by the new memory value (S334) are repeated.

When the first timer counting value becomes equal to (approaches) the convergence period of time (corresponding to the indication "No" at S335, the update controller 242 starts to monitor the electric power source (S336). When the electric power source is powered-on (corresponding to the indication "No" at S336), the update controller 242 determines whether a second timer counting value becomes over a predetermined setting period of time or not (S337). When the second timer counting value becomes over the predetermined setting period of time (corresponding to the indication "Yes" at S337), the memory update processing is renewed from the step at S332. When the second timer counting value does not become over the predetermined setting period of time (corresponding to the indication "No" at S337), the update controller 242 continues to monitor the electric power source (S336). When the electric power source is powered-off (corresponding to the indication "Yes" at S336), the updating operation can be finished while the update controller 242 monitors the electric power source. In this embodiment, updating operation is performed at the predetermined time interval when electric power source is powered-on. In this point of view, the updating operation (memory value-setting operation) in this embodiment is effective under the condition that the time variation (e.g., due to the change in temperature of the external atmosphere) of the DC offset amount in the receiver 1 is relatively large.

Figure 6:
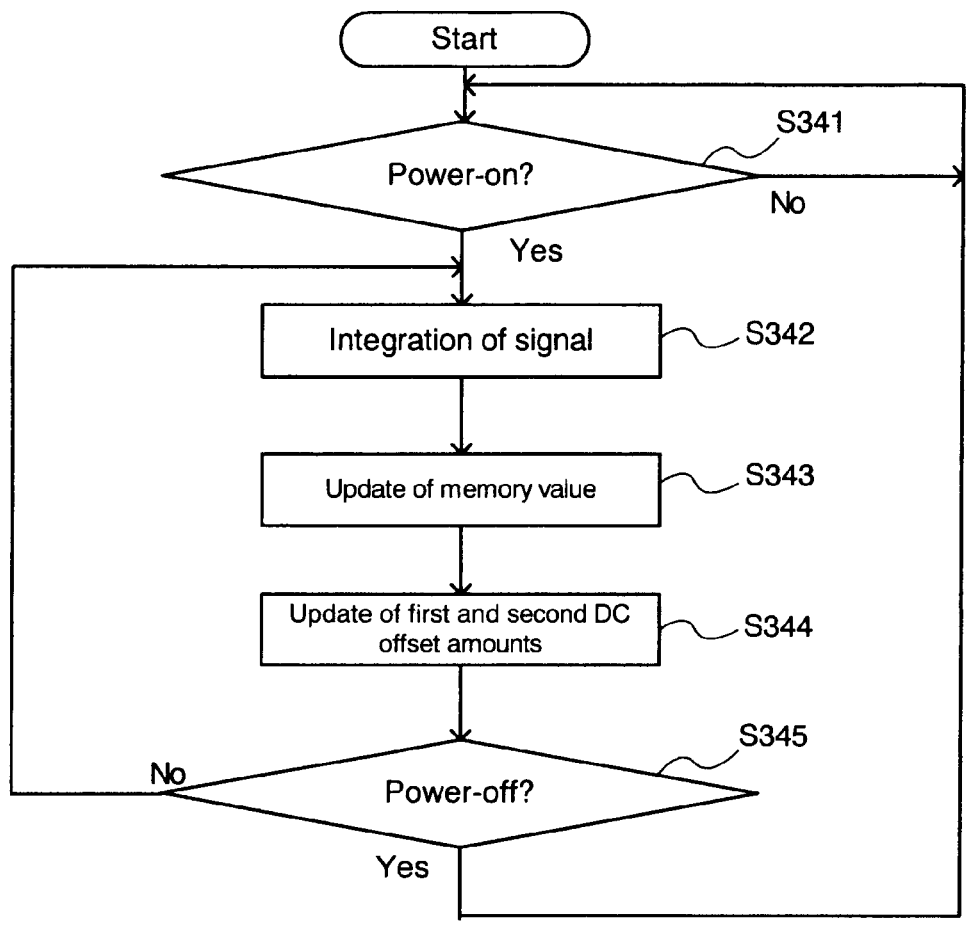
FIG. 6 is a further flowchart relating to the updating operation of a memory value in the receiver of the first embodiment.

Then, a further updating operation will be described with reference to FIG. 6. FIG. 6 is a flowchart relating to the updating operation in this embodiment. In this embodiment, the DC offset amount is always updated while the electric power source of the receiver 1 is powered-on. The update controller 242 always monitors the power condition of the receiver 1 (S341). When the update controller 242 detects the power-on of the receiver 1 (corresponding to the indication "Yes" at S341), the memory value-setting operation is performed. The first multiplier 122 multiplies the baseband signal (received signal) transmitted from the ADC 118 by the third multiplication value supplied from the third multiplication value-setting unit 124. The integrator 126 integrates the thus obtained multiplication value (S342). The memory controller 128 stores the thus obtained integration value into the memory 129 according to the indication from the updating controller 242 (S343).

The second multiplier 130 and the third multiplier 136 read out the corresponding memory values which are multiplied by the first multiplication value and the second multiplication value, respectively. The thus obtained multiplication data are supplied to the first DAC 134 and the second DAC 140, respectively, and converted into the corresponding analog data thereat. The thus obtained analog data is transmitted to the subtracters 112/113/116, respectively, so that the DC offset amount to be subtracted by the subtracters 112/113/116 can be updated (S344).

The update controller 242 always monitors the electric power source (S345). The update controller 242 always indicates the memory value renewal to the memory controller 128 while the electric power source is powered-on (corresponding to the indication "No" at S345). In this case, therefore, the steps at S342 through S344 are repeated. When the electric power source is powered-off (corresponding to the indication "No" at S345), the updating operation can be finished while the update controller 242 monitors the electric power source. In this embodiment, the updating operation is performed while the receiver 1 is operated. In this point of view, the updating operation (memory value-setting operation) in this embodiment is effective under the condition that the external environment and the receiving condition are remarkably changed.

In some of the embodiments relating to the updating operation, the convergence of the DC offset amount is determined in view of the predetermined period of time. However, the updating operation can be performed not using the convergence of the DC offset amount. For example, the output of the ADC 118 is monitored. In this case, when the output of the ADC 118 approaches a give amplitude level so that the ADC 118 is not saturated, the updating operation will be finished.

Figure 7:
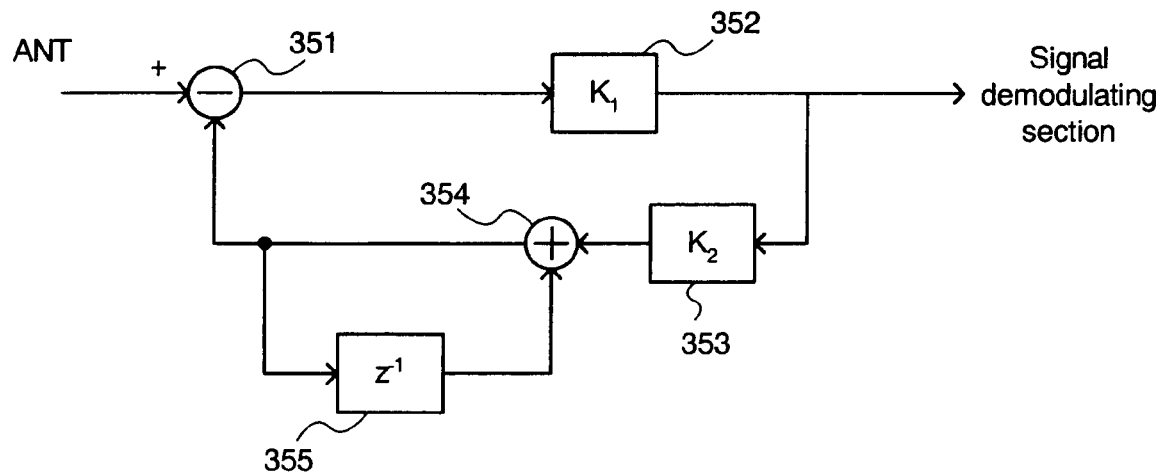
FIG. 7 is a block diagram for describing the principle in the removal of DC offset component.

Then, the principle of the DC offset cancelling operation in the receiver 1 will be described. FIG. 7 is a block diagram schematically showing the components operable as the DC offset canceller (which constitute the loop consisting of the first multiplier 122 through the subtracters 112/113/116).

The adder 354 and the delay element 355 in FIG. 7 correspond to the integrator 126 in FIG. 1. Similarly, the subtracter 351 in FIG. 7 corresponds to the substracters 112/113 in FIG. 1. The multiplier 352 with the multiplication value $K_1$ in FIG. 7 corresponds to the amplifier 114 in FIG. 1. The multiplier 353 with the multiplication value $K_2$ corresponds to the multipliers 130/136/122 with the respective first through third multiplication values in FIG. 1. In this case, the transfer function can be represented by the equation (2)

$$H(z) = \frac{K_1}{1 + \frac{K_1 K_2}{1 - z^{-1}}} \quad (2)$$

Suppose that the sampling frequency is set to T, the frequency characteristics of the entire loop can be represented by the equation (3)

$$H(e^{j\omega T}) = \frac{K_1(1 - e^{-j\omega T})}{1 + (K_1 K_2 - 1)} \quad (3)$$

As is apparent from the equation (3), the frequency characteristics is varied in accordance with the multiplication values $K_1$ and $K_2$. If the multiplication value $K_1$ is defined as a gain of the amplifier and the multiplication value $K_2$ is defined as a multiplication value for each of the multipliers, the frequency characteristics of the feedback loop can be determined on the gain of the amplifier and the multiplication value. If the cutoff frequency is set within a higher frequency range, the DC offset component can be cancelled rapidly, but some signal components within a lower frequency range may be removed. Alternatively, if the cutoff frequency is set within a lower frequency range, the signal components within the lower frequency range may not be removed remarkably so as to improve the receiving characteristics of the corresponding signal, but the DC offset component can not be removed rapidly. Namely, the high speed operationality of the DC offset canceller is traded off against the receiving characteristics. Therefore, the cutoff frequency is selected so as to optimize the trade-off relation between the high speed operationality of the DC offset canceller and the receiving characteristics. The gain of the amplifier and the first through third multiplication values can be determined from the cutoff frequency.

Figure 8:
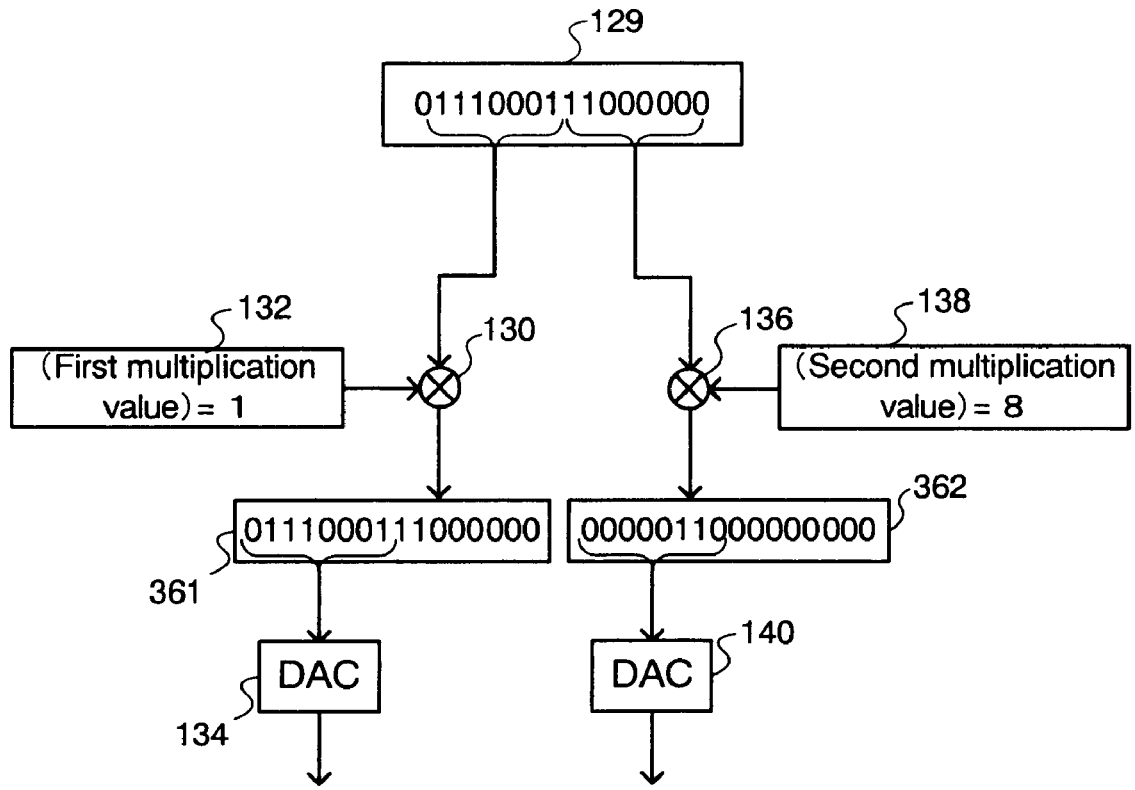
FIG. 8 is a block diagram relating to the concrete structure of the offset amount compensating unit in the receiver of the first embodiment.
Figure 9:
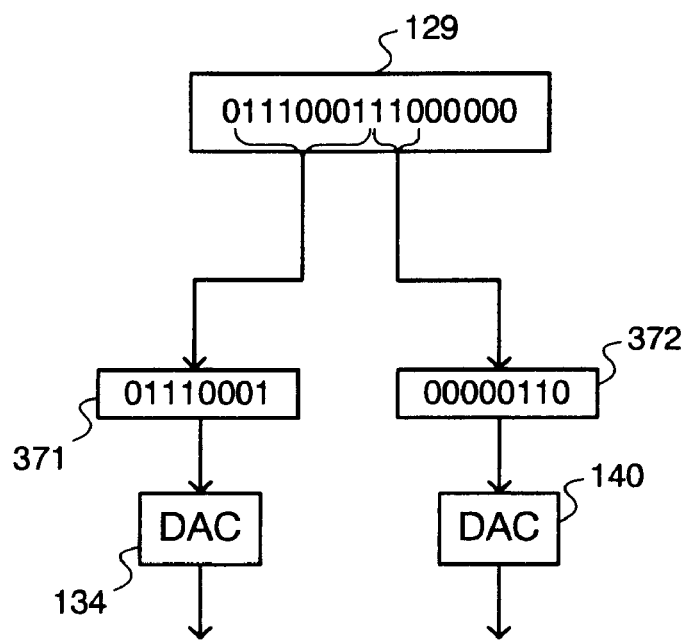
FIG. 9 is another block diagram relating to the concrete structure of the offset amount compensating unit in the receiver of the first embodiment.

Then, the concrete structures of the memory 129, the multipliers 130, 136 and the DACs 134, 140 will be described with reference to FIGS. 8 and 9. FIGS. 8 and 9 show the block diagram relating to the process where the DC offset amount stored in the memory 129 is converted into the corresponding analog DC offset amount through the first DAC 134 and the second DAC 140.

In the receiver 1 relating to the embodiments as described above, predetermined values stored in the memory 129 are supplied to the second multiplier 130 and the third multiplier 136 so that the second multiplier 130 can generate a rough DC offset amount and the third multiplier 136 can generate a fine DC offset amount in view of the gain of the amplifier 114. The predetermined values are allotted to the second multiplier 130 and the third multiplier 136 so that the baseband signal superimposed with the DC offset component can not be beyond the input margin of the ADC 118 and thus, distorted.

For example, suppose that the first multiplication value is set to 1 ($=2^0$), the second multiplication value is set to 8 ($=2^3$) and the 1LSB accuracy of the first DAC 134 is set equal to the 1LSB accuracy of the second DAC 140 so that the DAC resolution can be defined as 8 bit-resolution. As shown in FIG. 8, the memory 129 stores 16-bit data.

The second multiplier 130 reads out the upper 8 bits from the most significant bit (MSB) in the memory 129. The thus obtained bit data is transmitted to the first DAC 134 under no multiplication because the first multiplication value is set to 1. Since the DAC resolution is defined as 8-bit resolution, the first DAC 134 can not employ the lower 8 bits of the 16-bit memory value so that the subtracters 112/113 can not remove the DC offset component perfectly and thus, the DC offset component remains. The remaining DC offset component is amplified at the amplifier 114 and input into the subtracter 116.

The third multiplier 136 generates the DC offset amount to be subtracted from the remaining DC offset component using the remaining lower bits of the 16-bit memory value in the memory 129. In this embodiment, since the second multiplication value is set to $2^3$, the third multiplier 136 multiplies the lower 8 bits of the 16-bit memory value by the second multiplication value of $2^3=8$, thereby generating a new 16-bit memory value. Then, the upper 8 bits of the new 16-bit memory value are transmitted to the second DAC 140. Since the resolution of the second DAC 140 is defined as the 8-bit resolution, the intended DC offset amount can be generated using the upper 8 bits. The subtracters 116 subtracts the DC offset amount from the remaining DC offset component.

As shown in FIG. 8, when the first multiplication value and the second multiplication value are set to powers of two, respectively, the multiplication can be performed using bit shift calculation. In FIG. 9, the bit shift calculators 371 and 372 are employed instead of the multipliers 371 and 372.

Generally, suppose that the multiplication value is set to 2', since the second multiplier 130 uses the upper bits of the 16-bit memory value corresponding to the multiplication value of $2^m$, the input value for the second DAC 140 can be defined as some bits next to the upper bits to be employed by the second multiplier 130. In this embodiment relating to FIG. 9, since the second multiplication value is set to $2^3$, the bit shift calculator 372 selects the three bits, that is, 9-th bit through 11-th bit next to the upper 8 bits of the 16-bit memory value, which the three bits are input into the second DAC 140.

In this point of view, in this embodiment, the DC offset component can be removed in the same manner as the embodiment using the multipliers 130 and 136. Namely, in this embodiment, only if the appropriate selections of bits from the memory value are performed by the bit shift calculators under the condition that the first multiplication value and the second multiplication value are set to powers of two, respectively, the DC offset component can be removed. In this embodiment, since the multipliers are not required, the total circuit structure can be simplified so as to reduce the cost for fabricating the circuit structure.

As described above, in the receiver 1 in those embodiments, since the DC offset component is removed before and after the amplifier, the DC offset component can be removed finely. Also, since the second multiplication value equal to or more than the gain of the amplifier is multiplied to the remaining DC offset component, the DC offset component can be removed even though the characteristics of some components of the receiver 1 may fluctuate when the DC offset amount to be removed from the DC offset component before the amplifier and the DC offset amount to be removed from the DC offset component after the amplifier are calculated.

Figure 10:
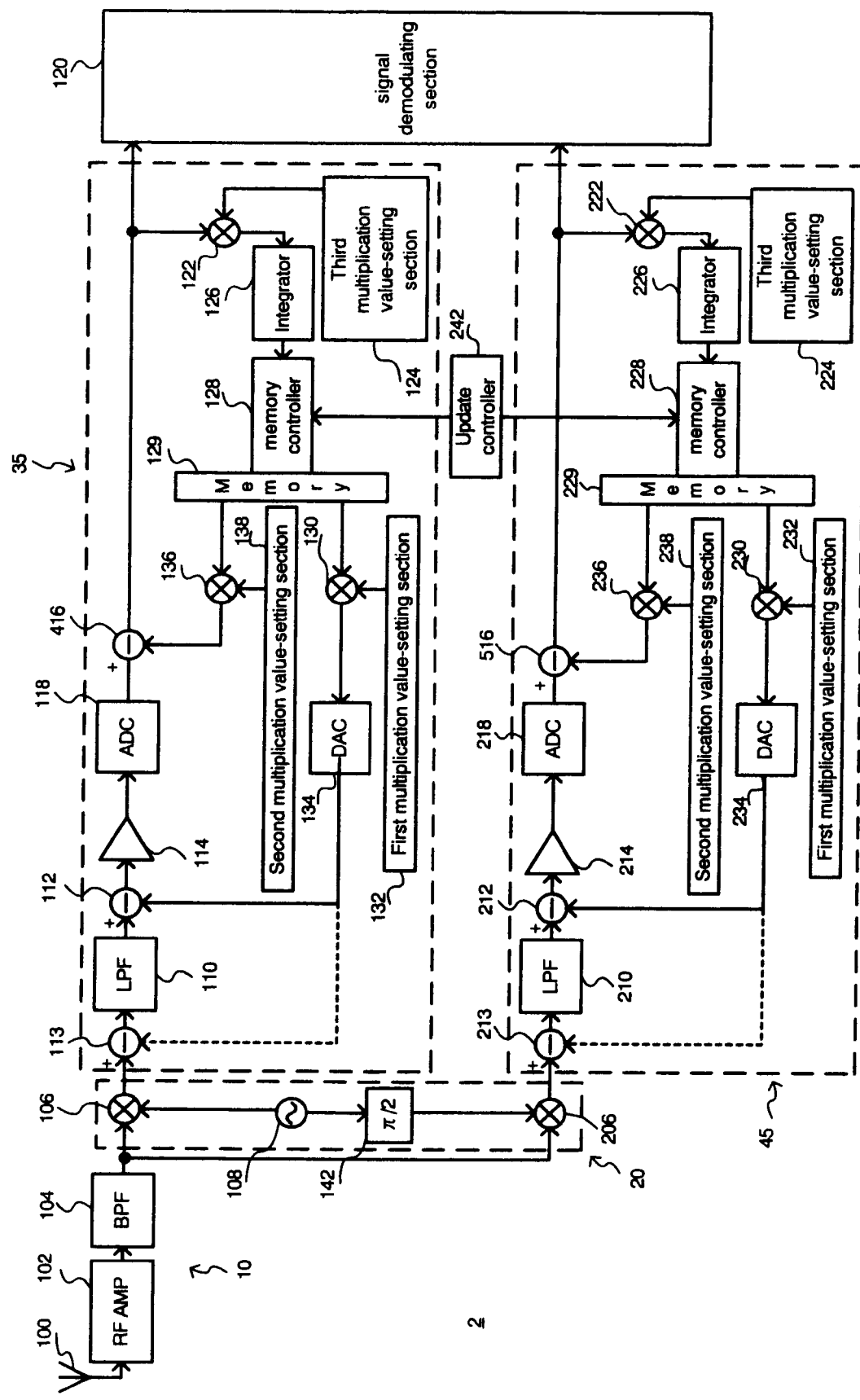
FIG. 10 is a block diagram relating to the structure of the receiver according to a second embodiment.

Then, a second embodiment will be described. FIG. 10 is a block diagram relating to the structure of the receiver according to the second embodiment. In the receiver 2 of this embodiment, as shown in FIG. 10, the subtracters 416/516, corresponding to the subtracter 116 in the first embodiment, are disposed at the outputs of the ADCs 118/218, not the input of the ADCs 118/218. Then, the DACs for the subtracters 416/516 are omitted. In this embodiment, the same function/ effect as the first embodiment can be exhibited. Moreover, since the DC offset component can be removed digitally at the output of the amplifier 114, the DAC and the like may be omitted so that the circuit structure can be simplified. Herein, another subtracter may be provided at the input of the ADC 118 so that the DC offset component can be removed in two stages at the output of the amplifier 114.

Figure 11:
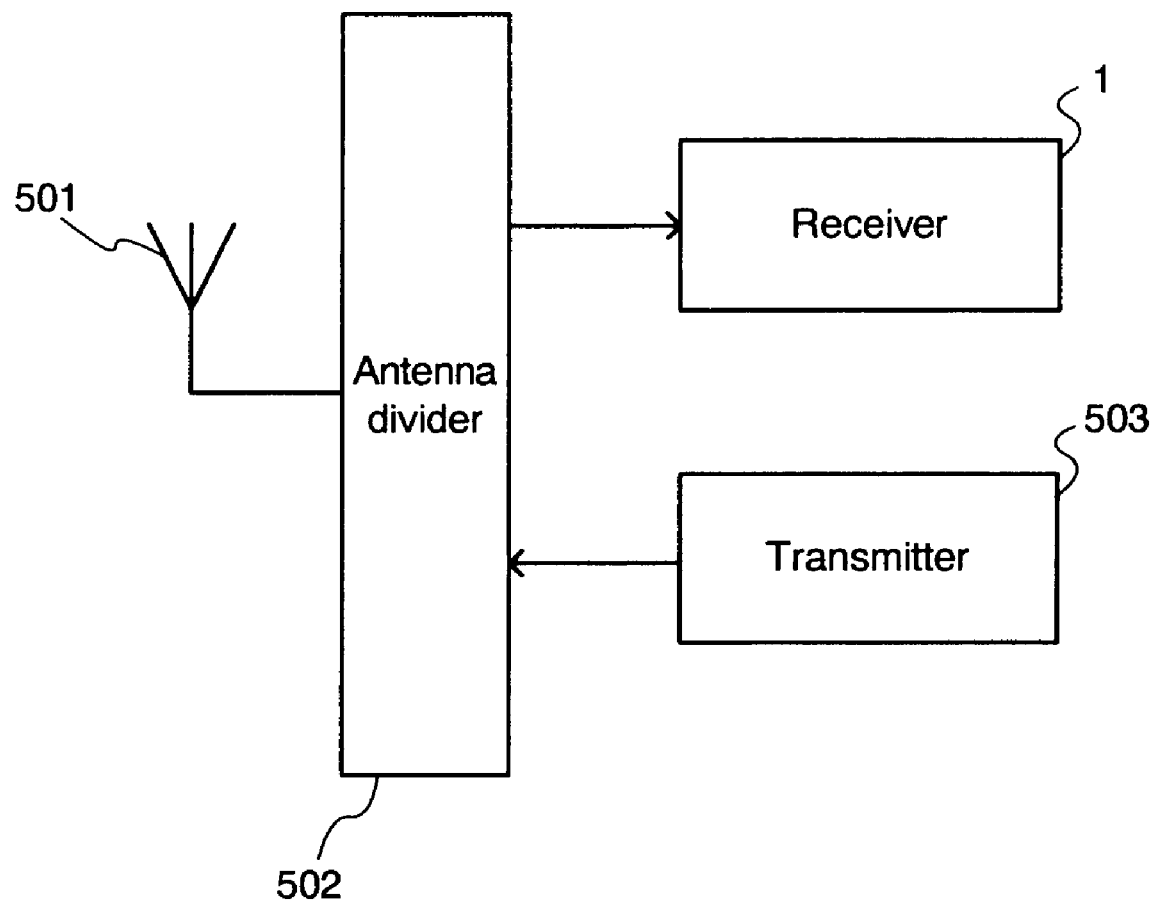
FIG. 11 is a block diagram relating to the structure of the wireless device according to a third embodiment.

Then, a third embodiment will be described. FIG. 11 is a block diagram relating to the structure of the wireless device according to the third embodiment. As shown in FIG. 11, the wireless device 3 in this embodiment includes an antenna 501, an antenna divider 502 to divide a transmitter signal and a receiver signal, the receiver 1 in the first embodiment and a transmitter 503 coupled with the receiver 1. According to the wireless device 3, since the receiver 1 is provided, the DC offset component can be removed finely. Herein, the receiver 2 in the second embodiment may be employed instead of the receiver 1.

Although the present invention was described in detail with reference to the above examples, this invention is not limited to the above disclosure and every kind of variation and modification may be made without departing from the scope of the present invention. For example, some components in the embodiments may be combined with one another to form a new receiver and the like within the scope of the present invention. Moreover, one or more components in the embodiments may be omitted.

What is claimed is:

1. A receiver comprising:
a memory for storing DC offset amounts in accordance with a DC offset component remaining in a received signal;
a first DC offset component-removing unit configured so as to generate a first DC offset amount from said DC offset amounts and to remove said first DC offset amount from said received signal;
an amplifier for amplifying a signal output from said first DC offset component-removing unit; and
a second DC offset component-removing unit configured so as to generate a second DC offset amount from said DC offset amounts stored in said memory in view of a gain of said amplifier and remove said second DC offset amount from said signal amplified by said amplifier.

2. The receiver as set forth in claim 1, further comprising:
an A/D converter for converting a signal output from said second DC offset component-removing unit into a digital signal;
an integrator for integrating said digital signal converted by said A/D converter; and
a controller for storing said signal integrated by said integrator as one of said DC offset amounts into said memory.

3. The receiver as set forth in claim 2,
wherein said controller is configured such that said signal integrated by said integrator is stored in said memory at a predetermined timing.

4. The receiver as set forth in claim 1,
wherein said first DC offset component-removing unit comprises a first multiplier for multiplying one of said DC offset amounts by a first multiplication value and a first D/A converter for converting data obtained through said first multiplier into the corresponding analog data as said first DC offset amount;
wherein said second DC offset component-removing unit comprises a second multiplier for multiplying one of said DC offset amounts by a second multiplication value equal to or more than a value obtained by multiplying said first multiplication value by said gain of said amplifier and a second D/A converter for converting said data obtained through said second multiplier into the corresponding analog data as said second DC offset amount.

5. The receiver as set forth in claim 4,
wherein said first offset component-removing unit is configured so as to generate said first DC offset amount equal to or more than a least significant bit representing an accuracy of said first D/A converter.

6. The receiver as set forth in claim 4,
wherein said second offset component-removing unit is configured so as to generate said second DC offset amount less than a least significant bit representing an accuracy of said second D/A converter.

7. The receiver as set forth in claim 1, further comprising:
an update controller for updating said DC offset amounts stored in said memory; and
a memory controller for storing said DC offset amounts updated by said update controller.

8. A wireless device, comprising;
a receiver as defined in claim 1 for receiving a given receiver signal;
a transmitter for transmitting a given transmitter signal and coupled with said receiver; and
an antenna for receiving said receiver signal and transmitting said transmitter signal.

9. A method for cancelling a DC offset component, comprising;
storing DC offset amounts in a memory in accordance with a DC offset component remaining in a received signal;
generating a first DC offset amount from said DC offset amounts stored in said memory and removing said first DC offset amount from said received signal;
amplifying said received signal by an amplifier by a predetermined gain after said first DC offset amount is removed; and generating a second DC offset amount from said DC offset amounts stored in said memory in view of said gain of said amplifier and removing said second DC offset amount from said received signal amplified by said amplifier.

10. The method as set forth in claim 9,
wherein said first DC offset amount is removed from said received signal before said amplifier.

11. The method as set forth in claim 9,
wherein said second DC offset amount is removed from said received signal after said amplifier.

12. The method as set forth in claim 9, further comprising;
converting said received signal by an A/D converter into a digital signal after said second DC offset component is removed;
integrating said digital signal converted by said A/D converter by an integrator; and
storing said received signal integrated by said integrator as one of said DC offset amounts into said memory.

13. The method as set forth in claim 9,
wherein said received signal integrated by said integrator is stored in said memory at a predetermined timing.

14. The method as set forth in claim 9, further comprising:
multiplying one of said DC offset amounts by a first multiplication value by a first multiplier;
converting data obtained through said first multiplier into the corresponding analog data as said first DC offset amount by a first D/A converter;
multiplying one of said DC offset amounts by a second multiplication value equal to or more than a value obtained by multiplying said first multiplication value by said gain of said amplifier by a second multiplier; and
converting said data obtained through said second multiplier into the corresponding analog data as said second DC offset amount by a second D/A converter.

15. The method as set forth in claim 14,
wherein said first DC offset amount is equal to or more than a least significant bit representing an accuracy of said first D/A converter.

16. The method as set forth in claim 14,
wherein said second DC offset amount is less than a least significant bit representing an accuracy of said second D/A converter.

17. The method as set forth in claim 9, further comprising:
updating said DC offset amounts stored in said memory by an update controller; and
storing said DC offset amounts updated by said update controller by a memory controller.

18. A receiver comprising:
a memory for storing DC offset amounts in accordance with a DC offset component remaining in a received signal;
a first DC offset component-removing unit configured so as to generate a first DC offset amount from said DC offset amounts stored in said memory and to remove said first DC offset amount from said received signal;
an amplifier for amplifying a signal output from said first DC offset component-removing unit;
an A/D converter for digitally converting a signal amplified by said amplifier; and
a second DC offset component-removing unit configured so as to generate a second DC offset amount from said DC offset amounts stored in said memory in view of a gain of said amplifier and remove said second DC offset amount from said signal digitally converted by said A/D converter.

\* \* \* \* \*